United States Patent
Park et al.

(10) Patent No.: US 9,843,295 B2
(45) Date of Patent: Dec. 12, 2017

(54) TRANSIMPEDANCE AMPLIFIER

(71) Applicant: EWHA UNIVERSITY-INDUSTRY COLLABORATION FOUNDATION, Seoul (KR)

(72) Inventors: Sung Min Park, Seongnam-si (KR); Seung Hoon Kim, Ulsan (KR)

(73) Assignee: EWHA UNIVERSITY-INDUSTRY COLLABORATION FOUNDATION, Seoul (KR)

( * ) Notice: Subject to any disclaimer, the term of this patent is extended or adjusted under 35 U.S.C. 154(b) by 0 days.

(21) Appl. No.: 15/311,095

(22) PCT Filed: Jun. 16, 2015

(86) PCT No.: PCT/KR2015/006046
§ 371 (c)(1),
(2) Date: Nov. 14, 2016

(87) PCT Pub. No.: WO2015/194817
PCT Pub. Date: Dec. 23, 2015

(65) Prior Publication Data
US 2017/0077878 A1    Mar. 16, 2017

(30) Foreign Application Priority Data

Jun. 19, 2014 (KR) .................. 10-2014-0074758
May 26, 2015 (KR) .................. 10-2015-0072819

(51) Int. Cl.
*H03F 3/08*          (2006.01)
*H03F 1/26*          (2006.01)
(Continued)

(52) U.S. Cl.
CPC .............. *H03F 1/26* (2013.01); *G01S 7/4868* (2013.01); *H03F 1/086* (2013.01); *H03F 3/082* (2013.01);
(Continued)

(58) Field of Classification Search
CPC ..................................... H03F 3/08; H03F 3/68
(Continued)

(56) References Cited

U.S. PATENT DOCUMENTS 6,307,660 B1 * 10/2001 Cordell .............. H04B 10/6911
                                                398/209
7,605,660 B1 * 10/2009 Kobayashi .............. H03F 1/083
                                                330/254
(Continued)

FOREIGN PATENT DOCUMENTS

JP       2003-258564 A      9/2003
JP       2006-101054 A      4/2006
(Continued)

OTHER PUBLICATIONS

International Search Report for PCT/KR2015/006046 dated Sep. 22, 2015 from Korean Intellectual Property Office.

*Primary Examiner* — Steven J Mottola
(74) *Attorney, Agent, or Firm* — Paratus Law Group, PLLC

(57) ABSTRACT

Disclosed is a transimpedance amplifier. The transimpedance amplifier includes an inverter configured to have a feedback resistor and amplify a signal provided to an input side, and a common gate amplifier configured to be connected to the inverter in cascade and amplify an output of the inverter, wherein the signal provided to the input side is fed forward to a gate of the common gate amplifier through a gate resistor.

15 Claims, 12 Drawing Sheets

(51) Int. Cl.
  *G01S 7/486* (2006.01)
  *H03F 3/45* (2006.01)
  *H03F 1/08* (2006.01)
  *H03F 3/21* (2006.01)
  *H03F 3/30* (2006.01)

(52) U.S. Cl.
  CPC ........... *H03F 3/211* (2013.01); *H03F 3/3022* (2013.01); *H03F 3/45475* (2013.01); *H03F 2200/165* (2013.01); *H03F 2200/405* (2013.01); *H03F 2200/411* (2013.01); *H03F 2200/72* (2013.01); *H03F 2200/75* (2013.01)

(58) Field of Classification Search
  USPC .................. 330/308, 295, 311; 250/214 A
  See application file for complete search history.

(56) References Cited

U.S. PATENT DOCUMENTS

| | | |
|---|---|---|
| 2006/0071704 A1 | 4/2006 | Chiba |
| 2011/0156817 A1 | 6/2011 | Hwang et al. |

FOREIGN PATENT DOCUMENTS

| | | |
|---|---|---|
| JP | 2009-152992 A | 7/2009 |
| KR | 10-2003-0033395 A | 5/2003 |
| KR | 10-2006-0064981 A | 6/2006 |
| KR | 10-1109224 B1 | 1/2012 |

\* cited by examiner

[Fig. 1]
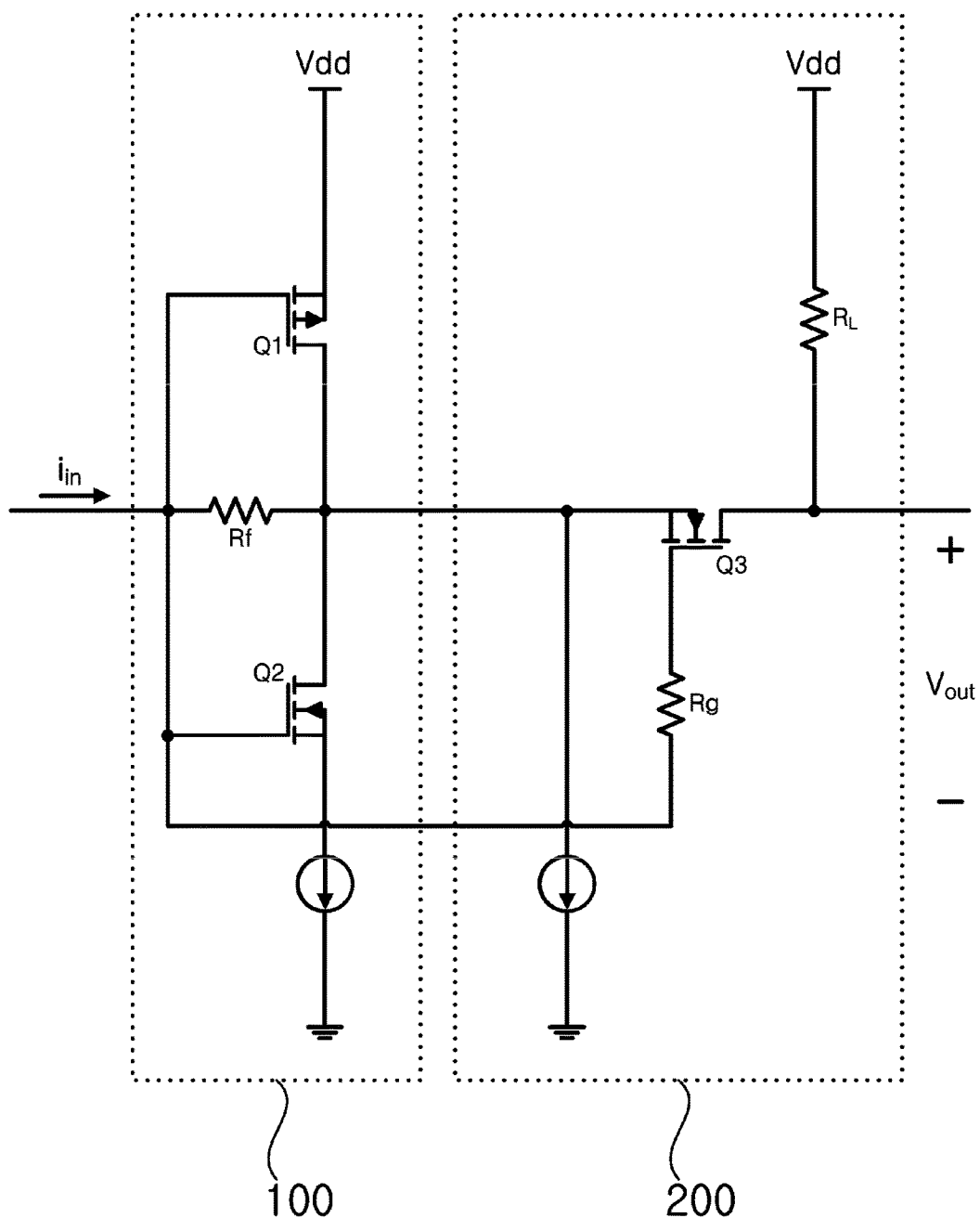

[Fig. 2]
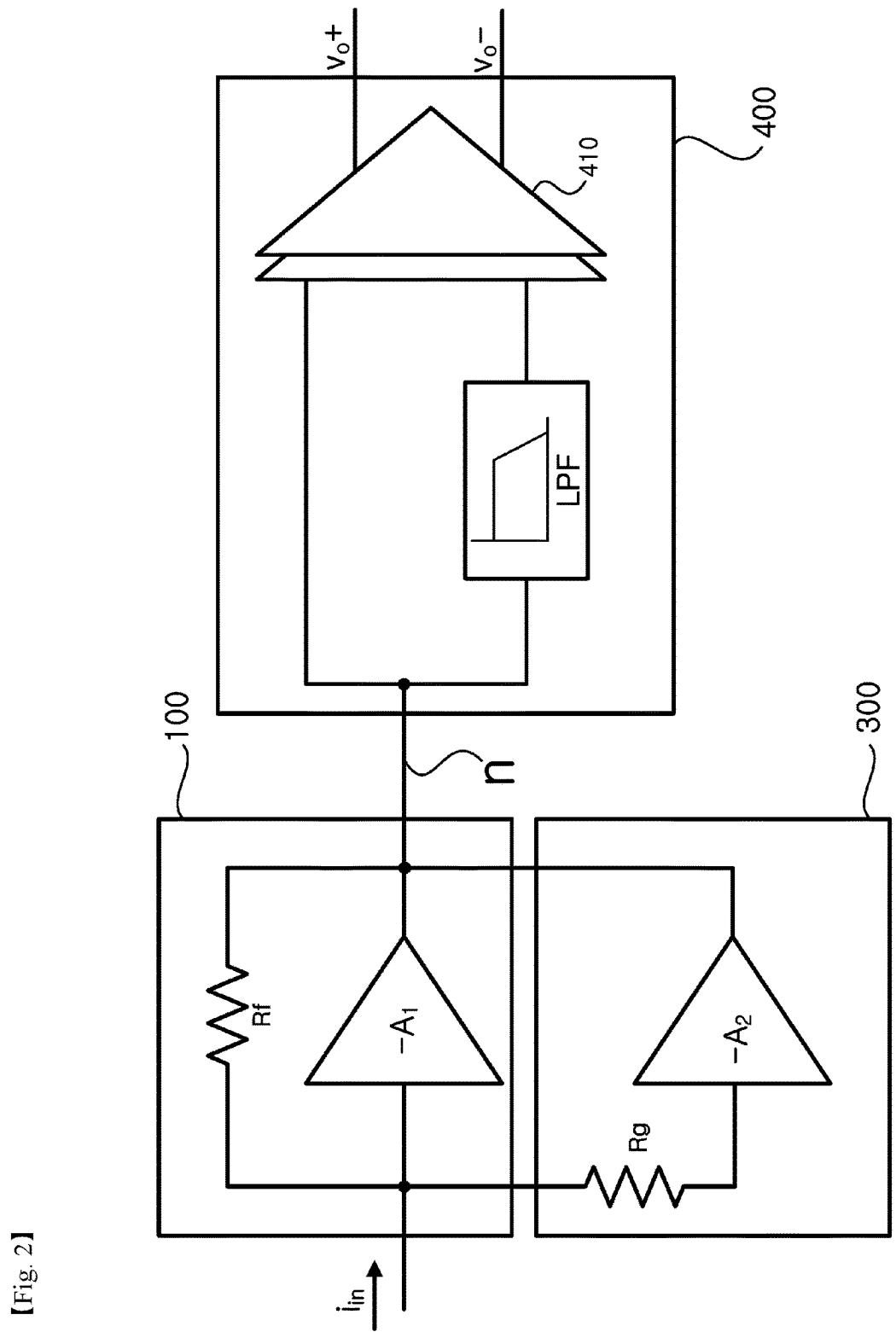

[Fig. 3]
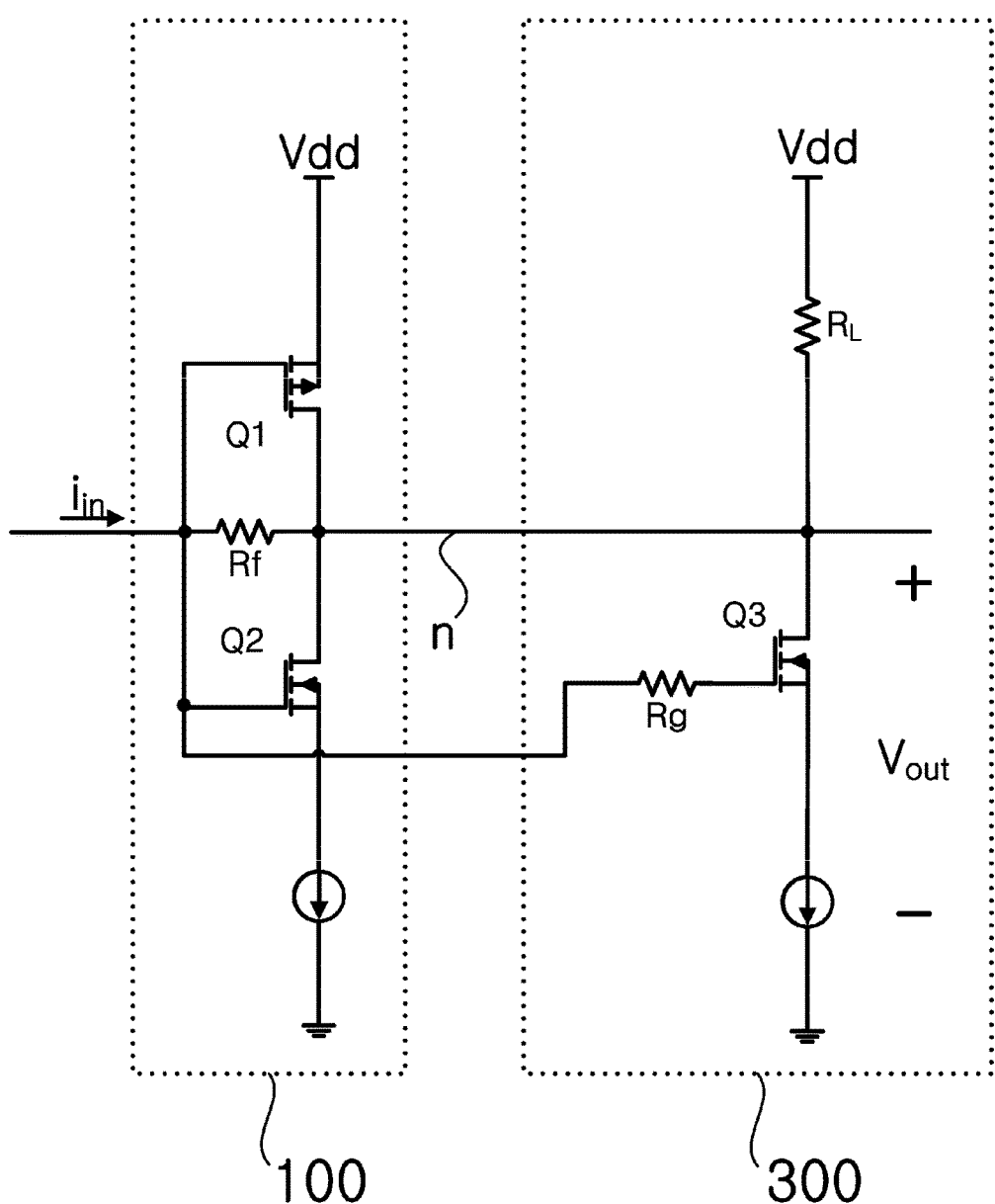

[Fig. 4]
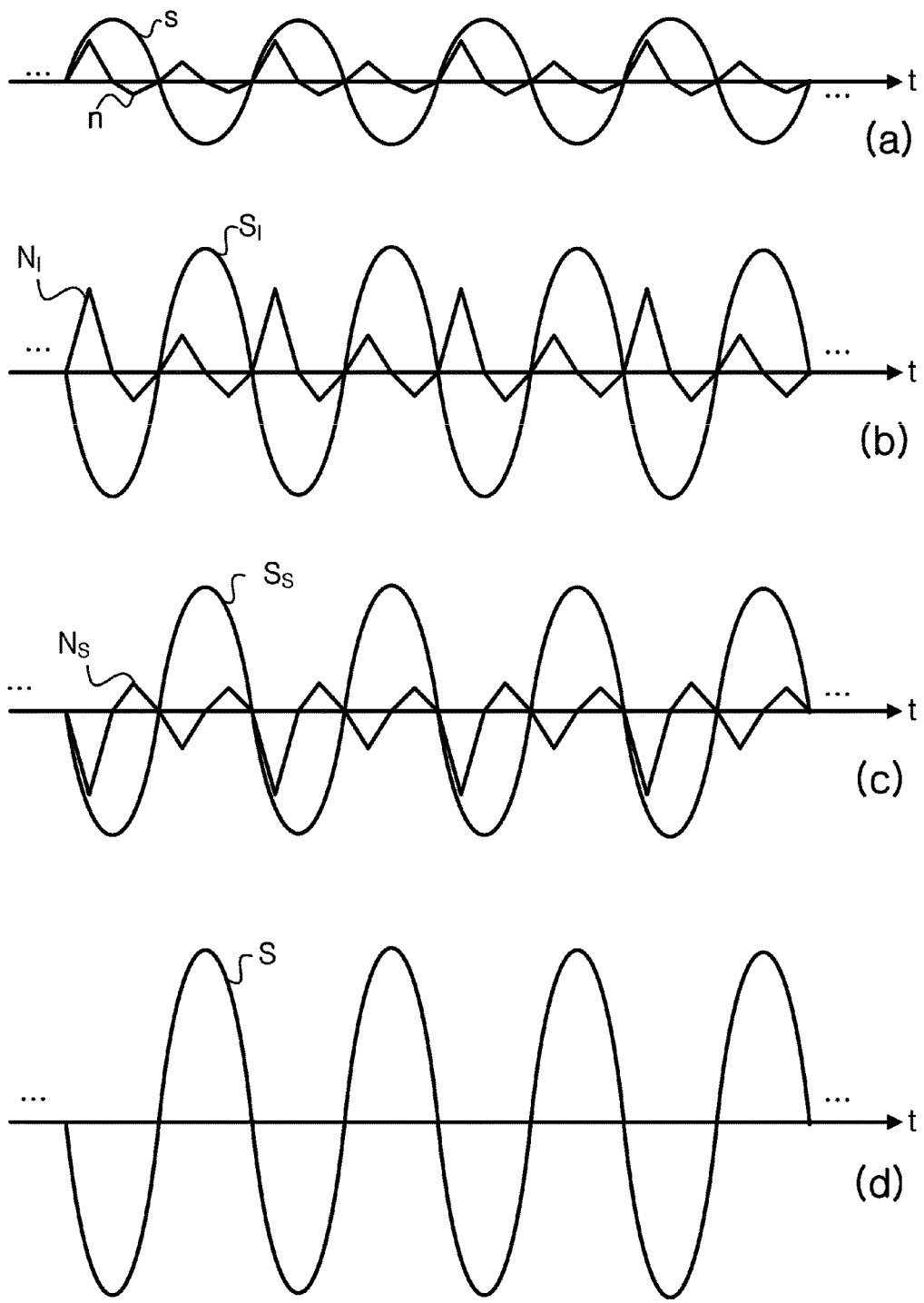

[Fig. 5]
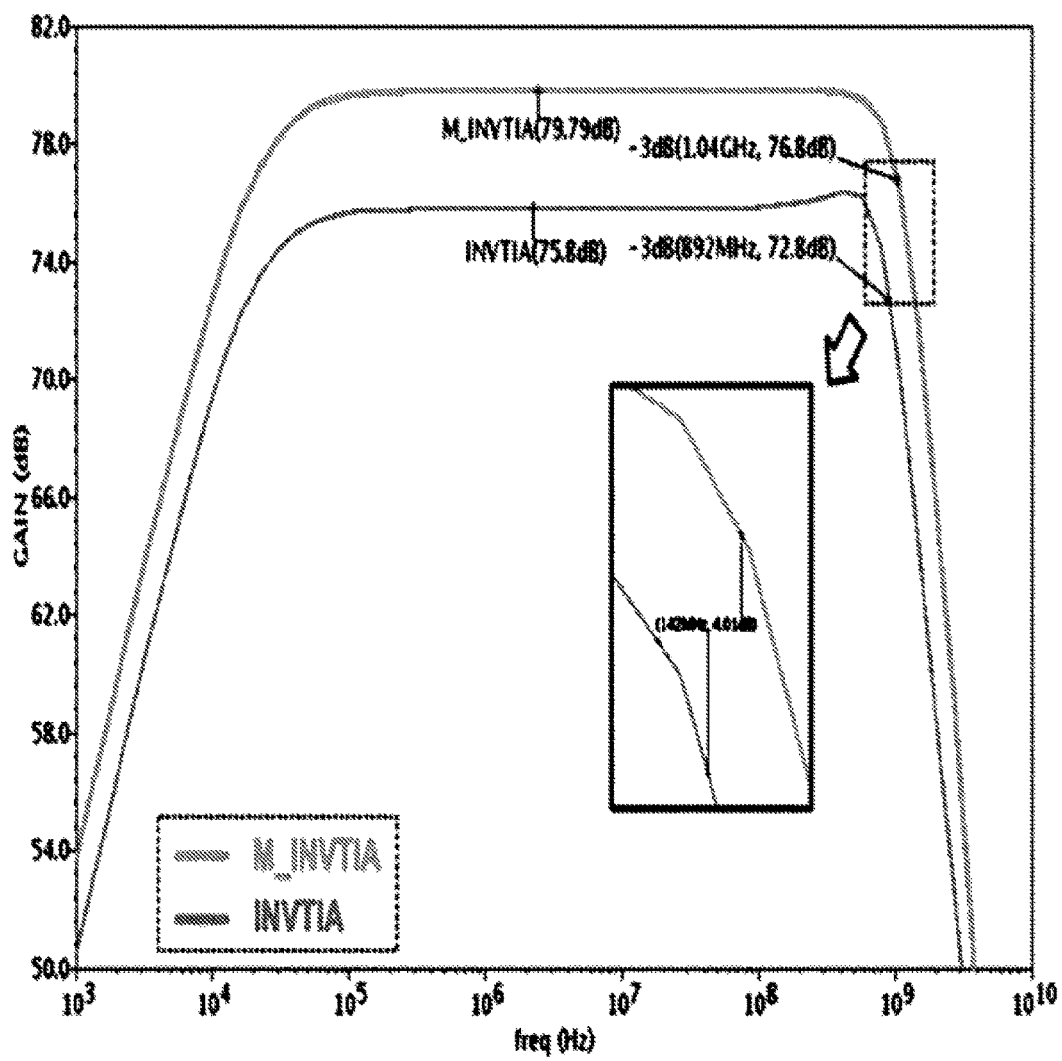

[Fig. 6]
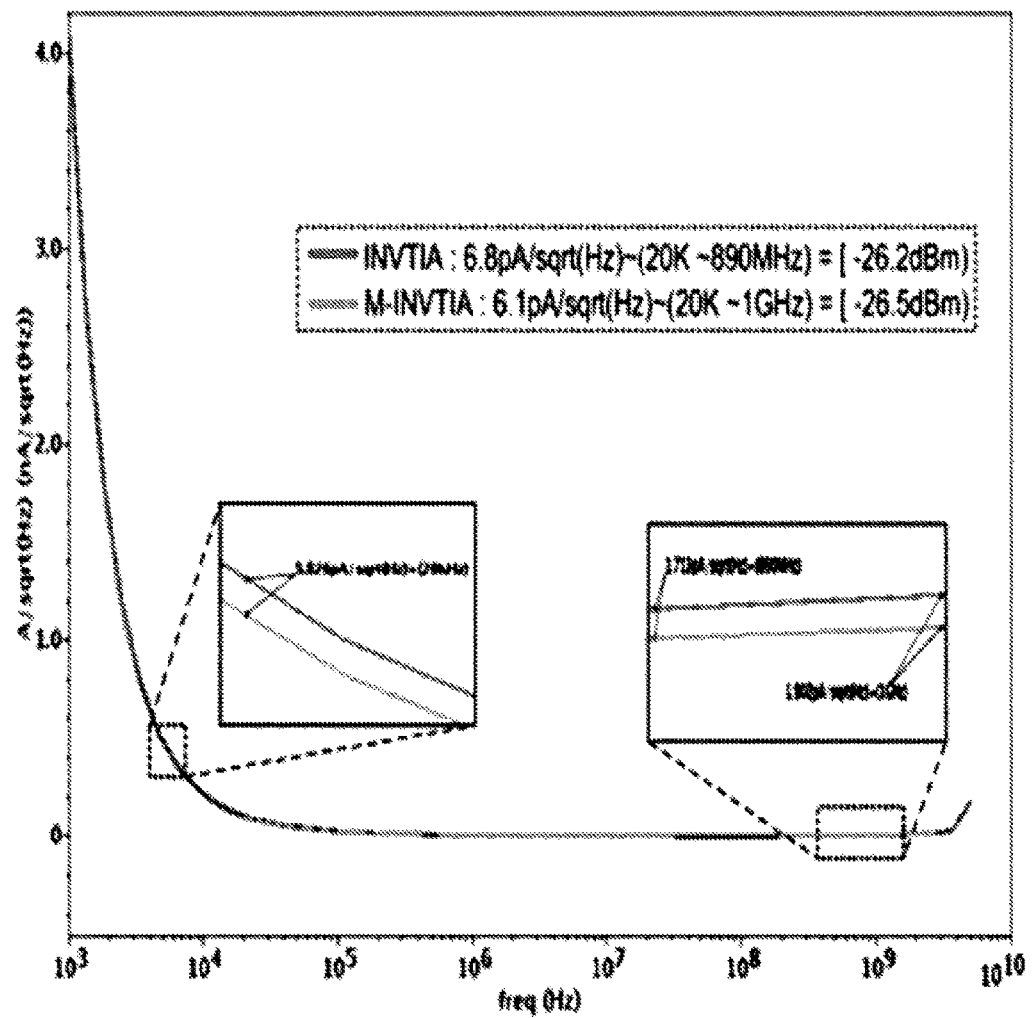

【Fig. 7】
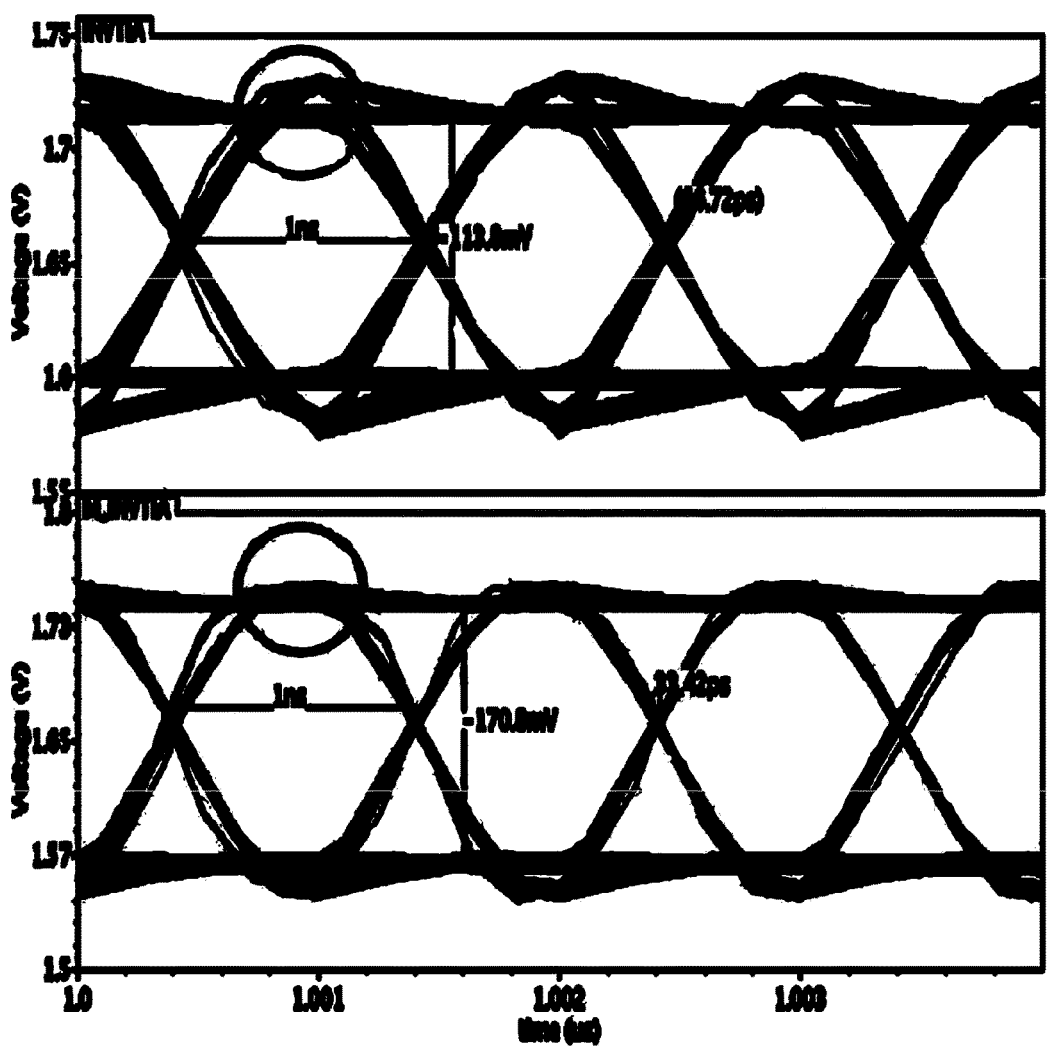

[Fig. 8]
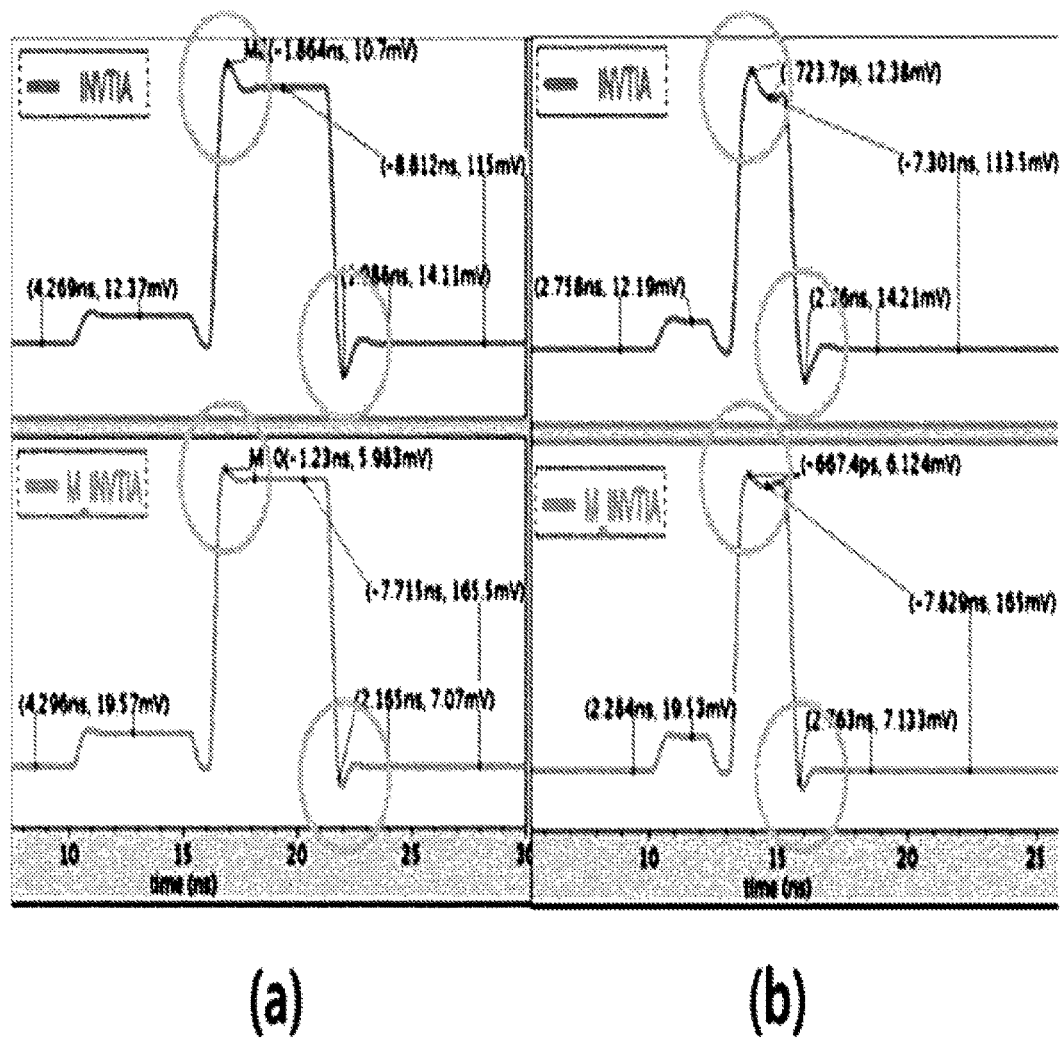
(a)          (b)

[Fig. 9]
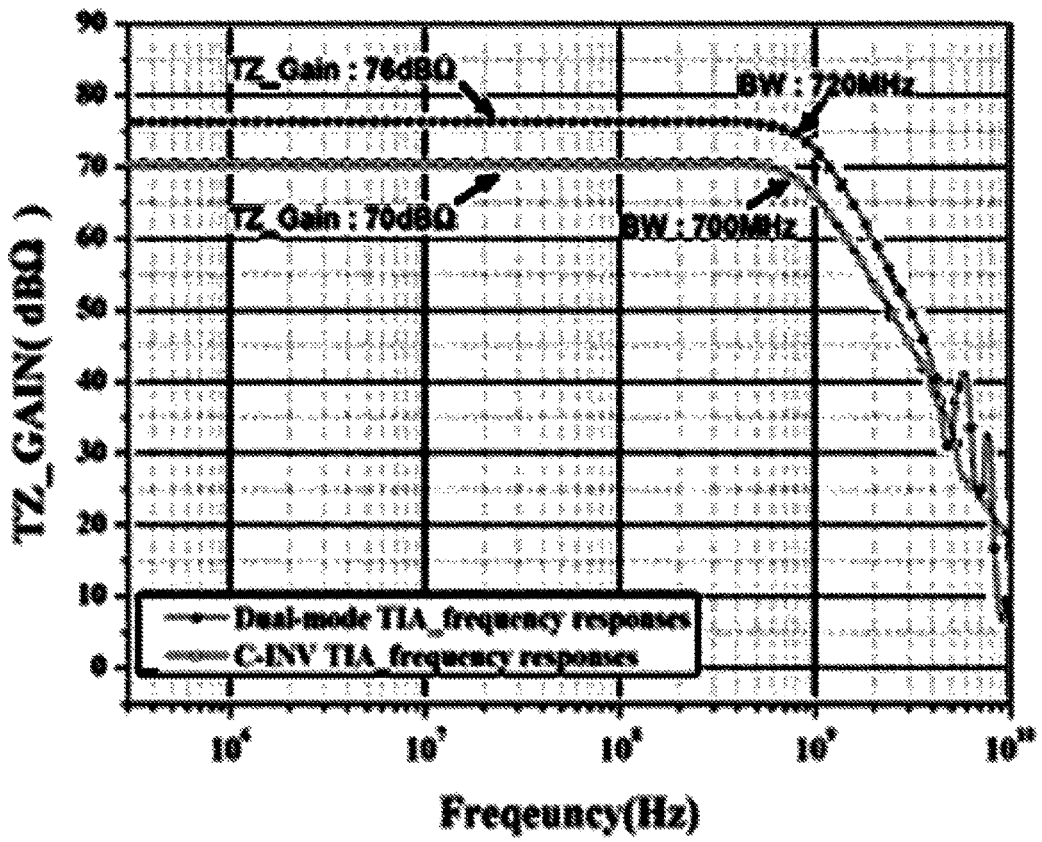

[Fig. 10]
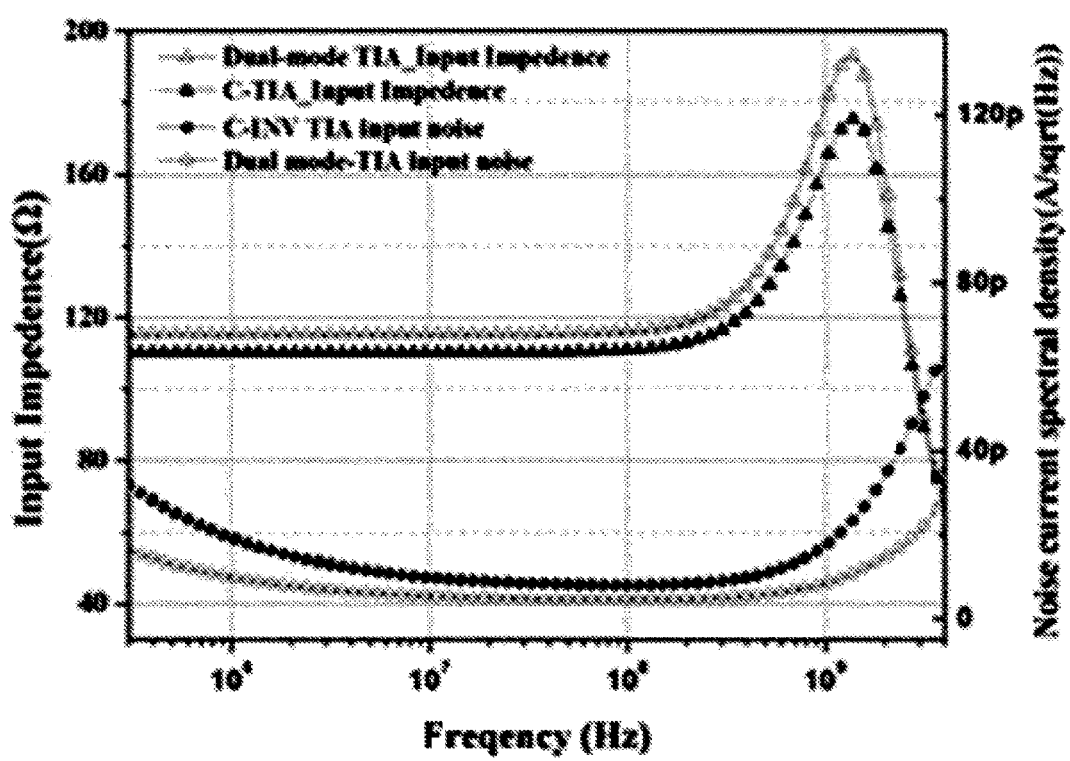

[Fig. 11]
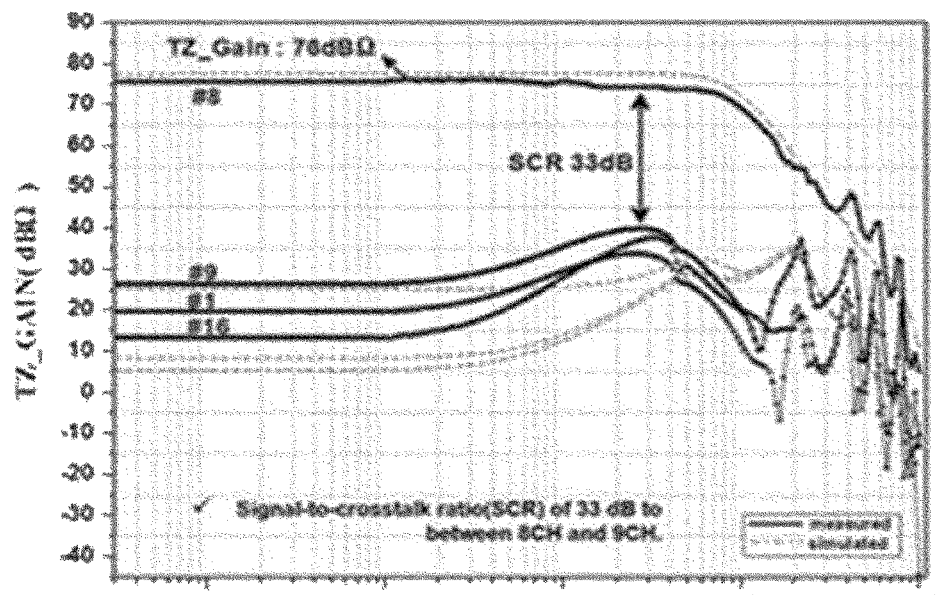
(a)
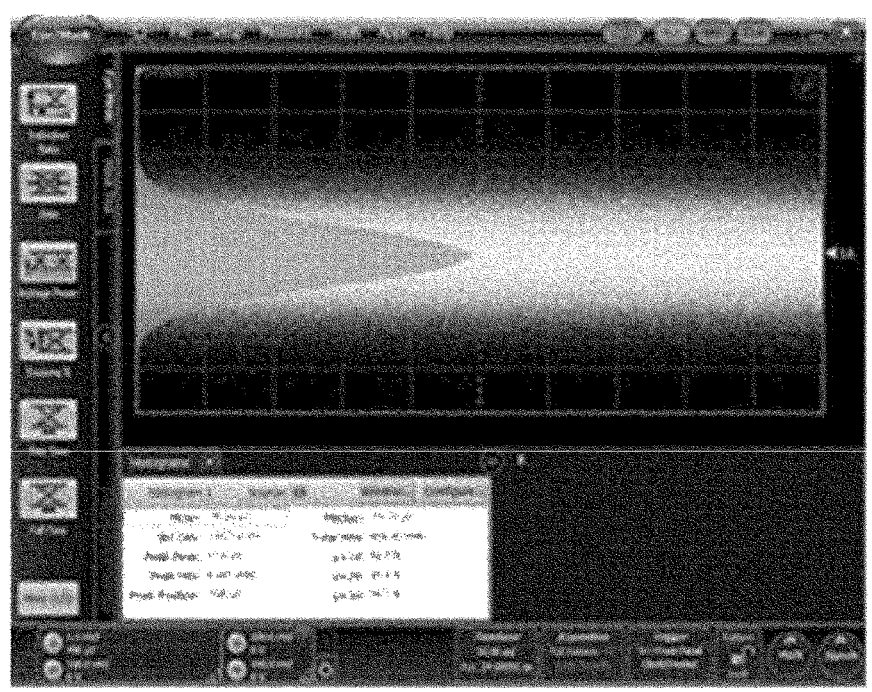
(b)

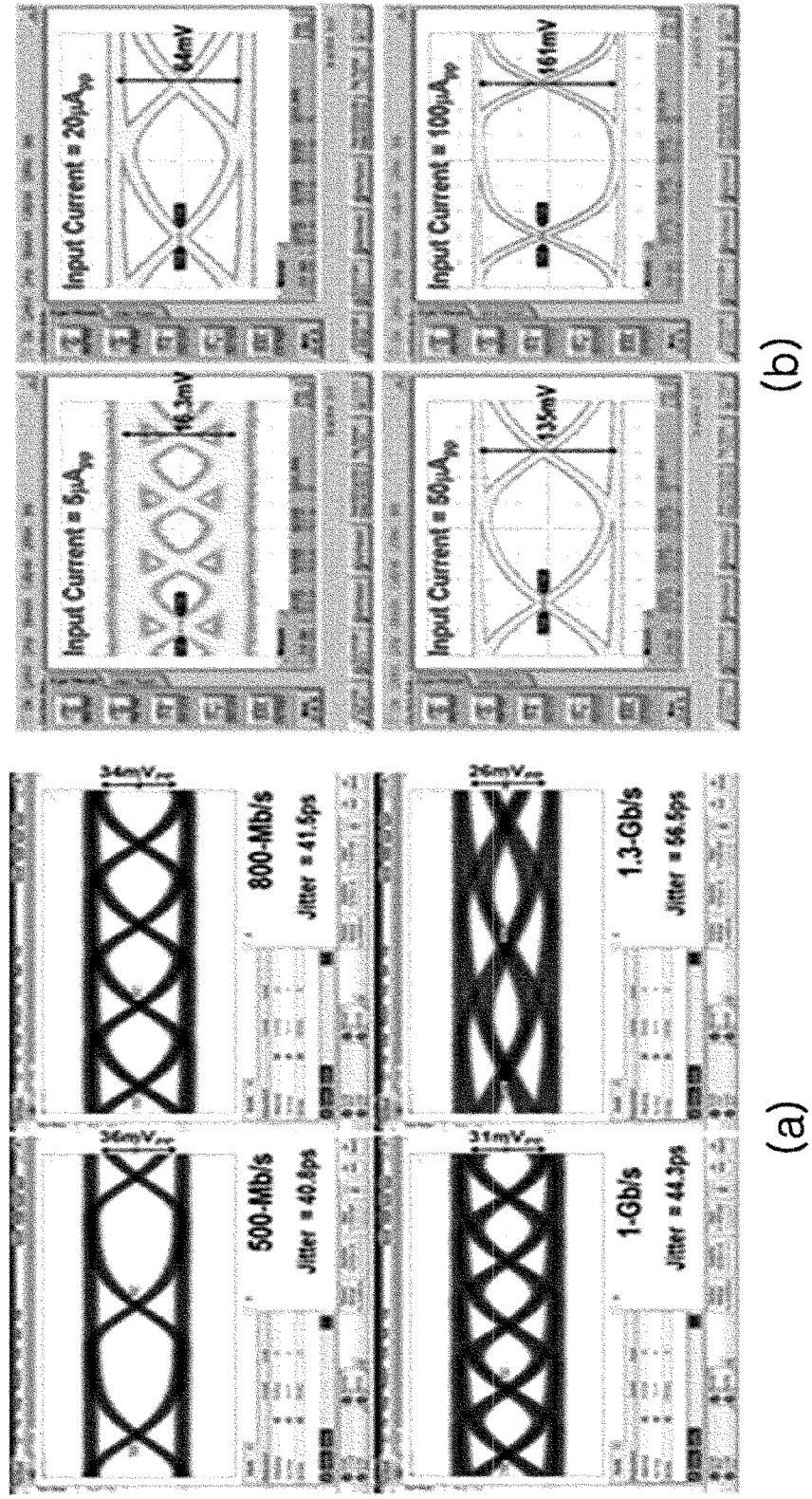
[Fig. 12]

TRANSIMPEDANCE AMPLIFIER

CROSS REFERENCE TO PRIOR APPLICATIONS

This application is a National Stage Patent Application of PCT International Patent Application No. PCT/KR2015/006046 (filed on Jun. 16, 2015) under 35 U.S.C. §371, which claims priority to Korean Patent Application Nos. 10-2014-0074758 (filed on Jun. 19, 2014) and 10-2015-0072819 (filed on May 26, 2015), which are all hereby incorporated by reference in their entirety.

BACKGROUND

The present invention relates to a transimpedance amplifier.

A transimpedance amplifier refers to an amplifier which converts a current signal provided as an input into a voltage signal using a transimpedance of the amplifier, amplifies the converted voltage signal, and outputs the amplified voltage signal. In order to obtain a high gain in a conventional transimpedance amplifier, a bandwidth of the amplifier should be sacrificed, and when wanting to implement an amplifier operating in a wide bandwidth, there is a trade off in which the gain should be sacrificed. Korean Patent Publication No. 2006-0064981 is a prior document of a conventional transimpedance amplifier.

In order to solve a problem of the conventional transimpedance amplifier described above, the present invention is directed to a transimpedance amplifier having a sufficient bandwidth and a high gain so as to operate at high speed.

Further, the present invention is directed to a transimpedance amplifier which is not sensitive to noise coming from a power source.

Moreover, the present invention is directed to a transimpedance amplifier maintaining a high gain without decreasing a bandwidth and having an excellent noise characteristic.

One aspect of the present invention provides a transimpedance amplifier including an inverter configured to have a feedback resistor and amplify a signal provided to an input side, and a common gate amplifier configured to be connected to the inverter in cascade and amplify an output of the inverter, wherein the signal provided to the input side is fed forward to a gate of the common gate amplifier through a gate resistor.

Another aspect of the present invention provides a transimpedance amplifier including an inverter configured to include a feedback resistor and amplify an input signal; and a common source amplifier configured to amplify the input signal, wherein the input signal is provided to a gate of the common source amplifier through a gate resistor, and an output signal of the inverter and an output signal of the common source amplifier are added in a common node.

According to an embodiment of the present invention, a high gain of the inverter and a wide operating bandwidth of a common gate amplifier may be obtained by having the inverter, the common gate amplifier, and a configuration in which the input signal is fed forward. Further, a low noise sensitivity characteristic may be obtained by the configuration described above.

According to an embodiment of the present invention, a transimpedance amplifier according to the embodiment may have advantages in which a high gain is obtained by adding signals amplified by the inverter and the common source amplifier, and also an excellent noise characteristic is obtained since noise included in the input signal is cancelled out in an output signal.

BRIEF DESCRIPTION OF THE DRAWINGS

FIG. 1 is a schematic circuit diagram illustrating a transimpedance amplifier according to one embodiment of the present invention;

FIG. 2 is a schematic block diagram illustrating a transimpedance amplifier according to another embodiment of the present invention;

FIG. 3 is a schematic circuit diagram illustrating an inverter and a common source amplifier according to an embodiment of the present invention;

(a) of FIG. 4 is a schematic diagram illustrating components of signals provided to an inverter and a common source amplifier according to an embodiment of the present invention, (b) of FIG. 4 illustrates a signal which an inverter outputs by receiving an input signal, (c) of FIG. 4 illustrates a signal which a common source amplifier outputs by receiving an input signal, and (d) of FIG. 4 is a diagram illustrating a waveform of an output signal formed by adding signals output by a common source amplifier and an inverter;

FIG. 5 is a diagram for comparing frequency responses of a transimpedance amplifier according to one embodiment of the present invention and a conventional transimpedance amplifier;

FIG. 6 is a diagram for comparing noise sensitivities of a transimpedance amplifier according to one embodiment of the present invention and a conventional transimpedance amplifier;

FIG. 7 is a diagram for comparing eye-diagrams of a transimpedance amplifier according to one embodiment of the present invention and a conventional transimpedance amplifier;

FIG. 8 is a diagram for comparing pulse responses of a transimpedance amplifier according to one embodiment of the present invention and a conventional transimpedance amplifier;

FIG. 9 is a diagram illustrating frequency-gain relation simulation test results of a transimpedance amplifier according to another embodiment of the present invention and a conventional transimpedance amplifier;

FIG. 10 is a diagram illustrating noise simulation test results of a transimpedance amplifier according to another embodiment of the present invention and a conventional transimpedance amplifier;

(a) of FIG. 11 illustrates a result measuring a frequency response by implementing a transimpedance amplifier according to another embodiment of the present invention as a chip, and (b) of FIG. 11 illustrates a result measuring noise by implementing a transimpedance amplifier according to another embodiment of the present invention as an actual chip; and (a) of FIG. 12 illustrates an eye-diagram measurement result of a chip classified according to operating speed, and (b) of FIG. 12 illustrates an eye-diagram measurement result of a chip classified according to input current.

DETAILED DESCRIPTION

Since a description related to the present invention is merely for explaining embodiments in a structural or functional description, it should be understood that the scope of the present invention is not limited by embodiments described in the specification. That is, since embodiments of the present invention are variously changeable and may have various forms, it should be understood that the scope of the present invention includes equivalents capable of implementing the technical spirit of the present invention.

Meanwhile, meanings of the terms described in the specification should be understood as follows.

Although the terms first, second, etc. may be used herein in order to differentiate one element from another element, the scope of the present invention is not to be construed as limited by these terms. For example, a first element could be termed a second element, and similarly, a second element could be termed a first element.

When one element is being described as located "on" or "above" another element, it should be understood that one element may be located directly on or above another element, or that there may be an intermediate element between the two elements. On the other hand, when one element is described as "in contact with" another element, it should be understood that there is no intermediate element between the two elements. Meanwhile, other expressions describing a relationship between elements, for example, "interpose~" and "directly interpose~", "between~" and "directly between" or "adjacent to~" and "directly adjacent to~", etc. should be understood in the same manner.

The articles "a," "an," and "the" are singular in that they have a single referent, however the use of the singular form in the present document does not preclude the presence of more than one referent. It should be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless steps are clearly described otherwise, each step may be performed differently from a flow of an operation described in the specification. That is, each step may be performed simultaneously, be substantially performed at the same time, or be performed in a reverse order.

In order to describe embodiments of the present invention, a size, a height, a thickness, etc. may be intentionally exaggerated in the accompanying drawings for convenience of explanation, and therefor may not be enlarged or reduced according to a ratio. Further, one element shown in the accompanying drawing may be expressed by being intentionally reduced, and another element may be expressed by being intentionally enlarged.

Unless otherwise defined, all terms used herein have the same meaning as commonly understood by one of ordinary skill in the art to which this invention belongs. It should be further understood that terms, such as those defined in commonly used dictionaries, be interpreted as having a meaning that is consistent with their meaning in the context of the relevant art and this specification, and are not to be interpreted in an idealized or overly formal sense unless expressly so defined herein.

First Embodiment

Hereinafter, a first embodiment of the present invention will be described with reference to the accompanying drawings. FIG. 1 is a schematic circuit diagram illustrating a transimpedance amplifier according to one embodiment of the present invention. Referring to FIG. 1, a transimpedance amplifier according to one embodiment of the present invention may include an inverter 100 and a common gate amplifier 200, the inverter and the common gate amplifier may be connected in cascade, an input signal $i_{in}$ input to the inverter may be fed forward to a gate of an NMOS transistor Q3 of the common gate amplifier through a gate resistor Rg. As an example, the input signal $i_{in}$ input to the inverter may be a signal provided from a photodiode or a laser diode detecting an optical signal or a laser signal which outputs a current corresponding to the detected signal.

The inverter 100 may include a PMOS transistor Q1 having a source connected to a supply voltage Vdd, an NMOS transistor Q2 having a source connected to a ground voltage, and a feedback resistor Rf having one end connected to an output terminal to which drains of the transistors Q1 and Q2 are connected, and the other end connected to an input terminal to which gates of the transistors Q1 and Q2 are connected.

When a voltage gain, which is a ratio of an output voltage to an input voltage, in an inverter which does not include the feedback resistor Rf is −A (A≫1), a ratio of an output voltage vo to the input current $i_{in}$ in an inverter including the feedback resistor Rf may be approximated by the following Equation 1. Accordingly, a gain of the output voltage to the input current may be controlled by controlling a value of the feedback resistor Rf in the inverter including the feedback resistor Rf.

$$\frac{v_o}{i_{in}} \approx -R_f. \qquad \text{[Equation 1]}$$

The common gate amplifier 200 may be connected to the inverter 100 in cascade, and receive the output signal of the inverter through a source of the transistor Q3, and output a voltage signal $V_{out}$ to a drain of the transistor Q3. Further, the current signal $i_{in}$ may be fed forward to the gate of the transistor Q3 through the gate resistor Rg.

The gate resistor Rg may decrease parasitic oscillation by the input current. The parasitic oscillation may occur by a gate capacitance of the transistor Q3 and an inductance of a line, and when the parasitic oscillation occurs, it may be difficult to ensure a sufficient operating speed since the transistor is not turned on or off rapidly, and additional power consumption may occur by a current flowing between the drain and the source. Since the parasitic oscillation may be damped by including the gate resistor Rg of several ohms to hundreds of ohms, the transistor may be turned on or off at high speed compared with a case which does not include the gate resistor, and thus a high operating frequency may be ensured and a great bandwidth may be obtained.

Since the common gate amplifier according to an embodiment of the present invention operates at high speed so that a wide bandwidth is obtained, a trade off problem between the gain of the inverter and the bandwidth may be solved by connecting the common gate amplifier to the inverter in cascade, and thus effects of a gain increase and a bandwidth increase may be obtained. As can be seen from a simulation test example which will be described hereinafter, noise sensitivity may not greatly differ from that of a conventional inverter transimpedance amplifier.

Second Embodiment

FIG. 2 is a block diagram illustrating a transimpedance amplifier according to another embodiment of the present invention. When describing another embodiment of the present invention, a description of a portion identical to or similar to the first embodiment may be omitted for brevity and clarity.

Referring to FIG. 2, a transimpedance amplifier according to another embodiment of the present invention may include a feedback resistor Rf, an inverter 100 amplifying an input signal, and a common source amplifier 300 amplifying the input signal, the input signal may be provided to a gate of the common source amplifier through the gate resistor Rg, and an output signal of the inverter and an output signal of the common source amplifier may be added in an identical node n.

An input signal $i_{in}$ provided to the transimpedance amplifier may be a current signal which a photodiode provides by detecting light of a constant wavelength band like the first embodiment described above. The inverter 100 may be similar to the inverter of the first embodiment described above. Accordingly, a description related to a duplicated portion will be omitted for convenience of explanation of this embodiment of the present invention.

The transimpedance amplifier may further include a differential amplifying stage 400 including a low pass filter (LPF) receiving a single-ended output signal and passing only a low frequency band signal of the signal-ended output signal, and a differential amplifier 410 receiving an output signal of the LPF and the single-ended output signal and outputting a differential signal $v_o+$, $v_o-$ generated by amplifying a difference of the two signals.

The single-ended output signal may be sensitive to noise. In the differential signaling scheme, noise added to the signal could be attenuated by differential amplifying operation and thus a differential signal component is amplified. It may be advantageous in terms of noise to perform a post signal processing operation using the differential signal $v_o+$, $v_o-$ output from the differential amplifying stage 400.

The differential amplifier 400 may have a configuration such as a differential amplifier having a common source amplifying pair in which sources are connected to each other, or a differential amplifier using one or more operational amplifiers (OP AMP). Further, other differential amplifiers which are not illustrated are not limited to be used for the differential amplifying stage 400.

FIG. 3 is a schematic circuit diagram illustrating an inverter 100 and a common source amplifier 300 according to an embodiment of the present invention. Referring to FIG. 3, a configuration of the inverter 100 may be identical to that shown in FIG. 1, and thus a detailed description thereof will be omitted.

The common source amplifier 300 may include a load resistor $R_L$ which has one end connected to a supply voltage Vdd and the other end connected to a drain of an NMOS transistor Q3 and the NMOS transistor Q3 having a gate receiving an input signal $i_{in}$ through a gate resistor Rg and a source which is electrically connected to a ground voltage. An output node of the inverter 100 and an output node of the common source amplifier 300 may be electrically connected.

The common source amplifier 300 may receive the input signal through the gate resistor Rg in order to attenuate the parasitic oscillation as described above. The transistor Q3 may be controlled to be turned on or off by a signal provided to the gate of the transistor Q3, and thus a current flowing through the load resistor $R_L$ may be controlled. The common source amplifier 300 may provide a voltage formed at both ends of the load resistor $R_L$ as the output voltage. A gain $-A2$ of the common source amplifier 300 may be set by controlling a value of the load resistor, but the gain may be increased as the value of the load resistor is increased.

(a) of FIG. 4 illustrates signals provided to an inverter 100 and a common source amplifier 300 according to an embodiment of the present invention. Referring to (a) of FIG. 4, a signal s may be a signal for amplification. A signal n may be a noise component included in an input signal $i_{in}$. The noise component n shown in the drawing is for schematically illustrating noise, and as shown in the drawing, is not a periodic signal and actual noise may have a characteristic in which an amplitude and a frequency are random.

(b) of FIG. 4 illustrates a signal which an inverter 100 outputs by receiving the input signal shown in (a) of FIG. 4. Referring to (b) of FIG. 4, an inverter having a feedback resistor Rf may amplify the input signal by a predetermined gain $-A1$. Since an output signal $S_I$ of the inverter has a phase difference of 180 degrees with a phase of the input signal s, the gain may be expressed to have a negative (−) sign. The inverter 100 may amplify the signal component s for amplification among the input signal, and form the signal $S_I$ having a phase opposite to the signal component s. However, the inverter 100 may amplify the noise component n included in the input signal and form a signal $N_I$, but since a phase of the signal $N_I$ is not inverted, the signal $N_I$ may have an in-phase relationship with the noise component n of the input signal $i_{in}$.

(c) of FIG. 4 illustrates a signal which a common source amplifier 300 outputs by receiving the input signal shown in (a) of FIG. 4. Referring to (c) of FIG. 4, the common source amplifier may amplify the input signal using a predetermined gain $-A2$. Since the output signal of the common source amplifier has a phase difference of 180 degrees with a phase of the input signal, the gain may be expressed to have a negative (−) sign. Accordingly, the common source amplifier 300 may amplify the signal component s for amplification among the input signal, and form a signal $S_S$ having an inverted phase with the signal component s. The common source amplifier 300 may amplify the noise component included in a signal and form a signal $N_S$, but unlike the inverter 100, a phase of the signal $N_S$ may not be inverted. Accordingly, the phase of the signal $N_S$ may have a phase difference of 180 degrees with a phase of the noise component n of the input signal $i_{in}$.

(d) of FIG. 4 is a diagram illustrating a waveform of an output signal Vout formed by adding signals output by a common source amplifier 300 and an inverter 100. A signal component $S_I$ which the inverter 100 amplifies and forms and a signal component $S_S$ which the common source amplifier 300 amplifies and forms may not have a phase difference. Accordingly, when an output node of the common source amplifier 300 and an output node of the inverter 100 are formed as a single node, the two signal components may be added and a component S may be formed.

A noise component $N_I$ which the inverter 100 amplifies and forms and a signal component $N_S$ which the common source amplifier 300 amplifies and forms may have a phase difference of 180 degrees, and have an out-of-phase relationship. When adding the output signals including noise components n at the same node after amplifying each of the noise components n included in the input signal $i_{in}$ using a predetermined gain, the two signals $N_I$ and $N_S$ may be cancelled out. Accordingly, in the output signal of the transimpedance amplifier according to this embodiment, the noise component shown in (d) of FIG. 4 may be cancelled out, and only the signal component s may be amplified.

As described above, the gain of the common source amplifier 300 may be controlled by controlling the value of the load resistor $R_L$, and the gain of the inverter 100 may be controlled by controlling the value of the feedback resistor Rf as described with reference to Equation 1. In an ideal case, when the gain of the common source amplifier 300 and the gain of the inverter 100 are controlled to have the same value, the noise component included in the output signal Vout may be removed, and a gain increased by as much as +6 dB may be obtained by adding the gains of the inverter 100 and the common source amplifier 300.

According to this embodiment, since the noise component shown in (a) to (d) of FIG. 4 is removed, there may be an advantage in which a noise sensitivity is decreased in an input terminal of an optical communication circuit or a laser radar in which the transimpedance amplifier according to this embodiment is used. Further, according to this embodiment, the noise component may be cancelled out, and since the signal components are added in the output node after being amplified in the inverter and the common source amplifier, the gain may be further amplified by about two times as a gain (+6 dB).

The transimpedance amplifier according to embodiments described above may be used for a receiving stage of optical communication, a laser radar, etc. in which the conventional transimpedance amplifier is used.

Simulation Test and Experimental Example

FIG. 5 is a diagram for comparing frequency response characteristics of a transimpedance amplifier according to the first embodiment of the present invention and a conventional transimpedance amplifier. As shown in FIG. 5, it may be confirmed that the gain of the transimpedance amplifier according to the embodiment of the present invention is 79.79 dB, which is increased by about 4 dB in comparison to 75.8 dB which is that of the conventional transimpedance amplifier, and that a −3 dB cutoff frequency of the transimpedance amplifier according to the embodiment of the present invention is 1.04 GHz which is increased by about 150 MHz in comparison to 892 MHz which is that of the conventional transimpedance amplifier. That is, it may be seen that the transimpedance amplifier according to the embodiment of the present invention may have an improved bandwidth characteristic and an improved gain compared with the conventional transimpedance amplifier.

FIG. 6 is a diagram for comparing noise sensitivities of a transimpedance amplifier according to an embodiment of the present invention and a conventional transimpedance amplifier. As shown in FIG. 6, a noise sensitivity curve of the conventional transimpedance amplifier and a noise sensitivity curve of the transimpedance amplifier according to the embodiment of the present invention may not have a great difference. As shown in a square box, it may be confirmed that a difference of the noise sensitivities is merely 0.3 dB as a noise sensitivity characteristic of the conventional transimpedance amplifier is −26.2 dBm and a noise sensitivity characteristic of the transimpedance amplifier according to the embodiment of the present invention is −26.5 dBm, and thus the noise sensitivity characteristic of the transimpedance amplifier according to an embodiment of the present invention is not greatly deteriorated.

FIG. 7 is a diagram for comparing eye-diagrams of a transimpedance amplifier according to an embodiment of the present invention and a conventional transimpedance amplifier, and FIG. 8 is a diagram for comparing pulse responses of a transimpedance amplifier according to an embodiment of the present invention and a conventional transimpedance amplifier. (a) of FIG. 8 is a diagram illustrating a response to a pulse having a separation period 2 ns, and a pulse width 5 ns, and (b) of FIG. 8 is a diagram illustrating a response to a pulse having a separation period 2 ns, and a pulse width 2 ns.

Referring to FIG. 7, from an eye-diagram of the conventional transimpedance amplifier shown at an upper portion, it may be confirmed that an overshoot occurs as shown by a circle when data is transitioned. However, from an eye-diagram of the transimpedance amplifier according to an embodiment shown at a lower portion, it may be confirmed that an overshoot does not occur and that there is a greater open portion than in the eye-diagram of the conventional transimpedance amplifier.

Further, as shown at upper portions of FIGS. 8A and 8B, when a pulse is applied, the overshoot shown by the circle may occur in the conventional transimpedance amplifier. However, it may be confirmed that the overshoot as shown at the lower portions is remarkably reduced in the transimpedance amplifier according to an embodiment of the present invention.

As described above, it may be confirmed that the transimpedance amplifier according to an embodiment of the present invention improves a gain characteristic and the bandwidth characteristic while maintaining the noise sensitivity similar to that of the conventional art, and it may be confirmed that the overshoot of a response is remarkably reduced as confirmed from the eye-diagram and the pulse response curve.

FIG. 9 is a diagram illustrating frequency-gain relation simulation test results of a conventional transimpedance amplifier and a transimpedance amplifier according to the second embodiment of the present invention. A gain change according to a frequency change of the conventional transimpedance amplifier corresponds to a lower curve, and a result according to the second embodiment of the present invention corresponds to an upper curve. As shown, although the transimpedance amplifier according to the second embodiment of the present invention has a bandwidth which is increased by 20 MHz in comparison to 700 MHz, which is the bandwidth of the conventional transimpedance amplifier, it may be confirmed that the gain is increased by 6 dB in comparison to the conventional art.

FIG. 10 is a diagram illustrating noise simulation test results of a conventional transimpedance amplifier and a transimpedance amplifier according to the second embodiment of the present invention. A spectrum density of a noise current of the conventional transimpedance amplifier is illustrated by black points that are connected, and a result according to the second embodiment of the present invention is illustrated by rhombi that are connected. As shown, since the spectrum density of the noise current of the transimpedance amplifier according to the second embodiment of the present invention is located in a lower portion compared to the spectrum density of the noise current of the conventional art in every frequency band, it may be confirmed that the noise characteristic is lower in comparison to that of the conventional art.

(a) of FIG. 11 illustrates a result of measuring a frequency response by implementing the transimpedance amplifier according to the second embodiment of the present invention as a chip, and (b) of FIG. 11 illustrates a noise measurement result obtained by implementing the transimpedance amplifier according to the second embodiment of the present invention as an actual chip. (a) and (b) of FIG. 11 verify the simulation result. In particular, in (b) of FIG. 11, it may be confirmed that a measurement result of the noise spectrum density is 6.4 pA/sqrt(Hz) and has good noise performance, and when anticipating reactivity of an optical device which is $10^{-12}$ BER and 0.9 A/W, it may be confirmed that very high sensitivity, which is −28.7 dBm, is obtained.

(a) and (b) of FIG. 12 are results obtained by measuring eye-diagrams using a chip which is actually implemented, (a) of FIG. 12 illustrates a result obtained by measuring the eye-diagram of a chip classified according to operating speed, and (b) of FIG. 12 illustrates a result obtained by measuring the eye-diagram of a chip classified according to input current. Referring to (a) and (b) of FIG. 12, it may be confirmed that a chip implemented according to an embodiment of the present invention shows a high operating speed, which is to 1.3 Gb/s, and has a broad dynamic range characteristic of an input current of 5 $uA_{pp}$ to 100 $uA_{pp}$.

While the present invention has been described with reference to the above-described exemplary embodiments, these should be considered in a descriptive sense only, and it should be apparent to those skilled in the art that various modifications can be made to the above-described exemplary embodiments of the present invention without departing from the spirit or scope of the invention and all such modifications and changes are included in the scope of the appended claims and their equivalents.

The invention claimed is:

1. A transimpedance amplifier, comprising:
an inverter configured to have a feedback resistor and amplify a signal provided to an input side; and
a common gate amplifier configured to be connected to the inverter in cascade and amplify an output of the inverter,
wherein the signal provided to the input side is fed forward to a gate of the common gate amplifier through a gate resistor.

2. The transimpedance amplifier of claim 1, wherein the transimpedance amplifier receives an optical current as an input and outputs a voltage signal.

3. The transimpedance amplifier of claim 1, wherein the gate resistor attenuates a parasitic oscillation in the gate of the common gate amplifier.

4. The transimpedance amplifier of claim 1, wherein the inverter includes a P-type metal oxide semiconductor field effect transistor (MOSFET) having a source connected to a supply voltage, and an N-type MOSFET having a source connected to a reference voltage, and
the feedback resistor includes one end which is electrically connected to a drain of the P-type MOSFET and a drain of the N-type MOSFET, and the other end which is electrically connected to a gate of the P-type MOSFET and a gate of the N-type MOSFET.

5. The transimpedance amplifier of claim 1, wherein the common gate amplifier includes a NMOS transistor, and
the NMOS transistor includes a source to which the output of the inverter is provided, a drain providing an output signal, and a gate to which the signal which is fed forward through the gate resistor is provided.

6. The transimpedance amplifier of claim 1, wherein the transimpedance amplifier is disposed at an input terminal of an optical communication circuit and an input terminal of a laser radar.

7. A transimpedance amplifier, comprising:
an inverter configured to include a feedback resistor and amplify an input signal; and
a common source amplifier configured to amplify the input signal,
wherein the input signal is provided to a gate of the common source amplifier through a gate resistor, and an output signal of the inverter and an output signal of the common source amplifier are added in a common node.

8. The transimpedance amplifier of claim 7, wherein the transimpedance amplifier has a gain obtained by adding a gain of the inverter and a gain of the common source amplifier.

9. The transimpedance amplifier of claim 7, wherein the output signal of the inverter includes a component in which the input signal is amplified with a phase inversion, and a component in which noise intervening in the input signal is amplified without a phase inversion, and
the output signal of the common source amplifier includes a component in which the input signal is amplified with the phase inversion, and a component in which the noise intervening in the input signal is amplified with the phase inversion.

10. The transimpedance amplifier of claim 9, wherein the output signal of the inverter and the output signal of the common source amplifier are added in an identical node, and the components due to the noise cancel each other out.

11. The transimpedance amplifier of claim 9, wherein the output signal of the inverter and the output signal of the common source amplifier are added in an identical node, and the components due to the input signal are added to each other.

12. The transimpedance amplifier of claim 7, wherein a gain of the inverter and a gain of the common source amplifier are set to be equal to each other.

13. The transimpedance amplifier of claim 7, wherein the common source amplifier includes a load resistor connected to a supply voltage, and a NMOS transistor in which one electrode and the other electrode are connected to the load resistor and a ground voltage, respectively,
a gain of the common source amplifier is controlled by a resistance value of the load resistor, and
a gain of the inverter is controlled by a value of the feedback resistor.

14. The transimpedance amplifier of claim 7, further including an amplifying stage configured to amplify an output signal of the transimpedance amplifier,
wherein the amplifying stage includes:
a low pass filter (LPF) configured to receive the output signal and pass a component of a low frequency band; and
a differential amplifier configured to receive the output signal of the transimpedance amplifier as a one input, receive an output signal of the LPF as the other input, and amplify a difference of the output signal of the transimpedance amplifier and the output signal of the LPF.

15. The transimpedance amplifier of claim 7, wherein the transimpedance amplifier is disposed at an input terminal of an optical communication circuit or an input terminal of a laser radar.

* * * * *